(12) United States Patent
Hosseini et al.

(10) Patent No.: US 7,579,675 B2
(45) Date of Patent: Aug. 25, 2009

(54) SEMICONDUCTOR DEVICE HAVING SURFACE MOUNTABLE EXTERNAL CONTACT AREAS AND METHOD FOR PRODUCING THE SAME

(75) Inventors: Khalil Hosseini, Weihmichl (DE); Alexander Koenigsberger, Regensburg (DE)

(73) Assignee: Infineon Technologies AG, Munich (DE)

( * ) Notice: Subject to any disclaimer, the term of this patent is extended or adjusted under 35 U.S.C. 154(b) by 453 days.

(21) Appl. No.: 11/370,441

(22) Filed: Mar. 8, 2006

(65) Prior Publication Data
US 2006/0237814 A1 Oct. 26, 2006

(30) Foreign Application Priority Data
Mar. 9, 2005 (DE) .................. 10 2005 011 159

(51) Int. Cl.
*H01L 23/495* (2006.01)
*H01L 23/10* (2006.01)
(52) U.S. Cl. .................. 257/675; 257/706; 257/707; 257/E23.051; 257/E23.101; 257/E23.102
(58) Field of Classification Search .............. 257/666, 257/678, 276, 625, 675, 706, 707, 712–722, 257/796, E33.075, E31.131, E23.051, E23.08–E23.113
See application file for complete search history.

(56) References Cited

U.S. PATENT DOCUMENTS

| 6,040,626 A | 3/2000 | Cheah et al. |
|---|---|---|
| 6,198,166 B1 | 3/2001 | Coronati |
| 6,249,041 B1 | 6/2001 | Kasem et al. |
| 6,319,755 B1 | 11/2001 | Mauri |
| 6,566,749 B1 * | 5/2003 | Joshi et al. .................. 257/706 |
| 6,630,726 B1 | 10/2003 | Crowley et al. |
| 6,723,582 B2 * | 4/2004 | Glenn et al. ................. 438/107 |
| 6,774,466 B1 | 8/2004 | Kajiwara et al. |
| 6,777,800 B2 * | 8/2004 | Madrid et al. ............... 257/690 |
| 6,784,537 B2 * | 8/2004 | Moriguchi .................. 257/706 |
| 6,992,386 B2 * | 1/2006 | Hata et al. .................. 257/735 |
| 2003/0113954 A1 | 6/2003 | Glenn et al. |

FOREIGN PATENT DOCUMENTS

| DE | 10003671 | 8/2000 |
| DE | 10134943 | 10/2002 |
| WO | 00/74131 A1 | 12/2000 |

* cited by examiner

*Primary Examiner*—Jasmine J Clark
(74) *Attorney, Agent, or Firm*—Dicke, Billig, Czaja PLLC

(57) ABSTRACT

A semiconductor device having surface-mountable external contact areas and a method for producing the same is disclosed. The surface-mountable external contacts are arranged as flat external contacts on the underside of the semiconductor device. In one embodiment, the semiconductor chip of the semiconductor device has a source contact area and a gate contact area on its top side and a drain contact area on its rear side. The source contact area is fixed on a cutout of a heat sink, which is connected to a source external contact, a top side of the heat sink partly forming the top side of the semiconductor device. The drain contact area is electrically connected to a drain external contact and the gate contact area is electrically connected via a connecting element to a gate external contact on the underside of the semiconductor device. Consequently, the semiconductor device as areas which dissipate the heat loss both on the underside and on the top side.

20 Claims, 5 Drawing Sheets

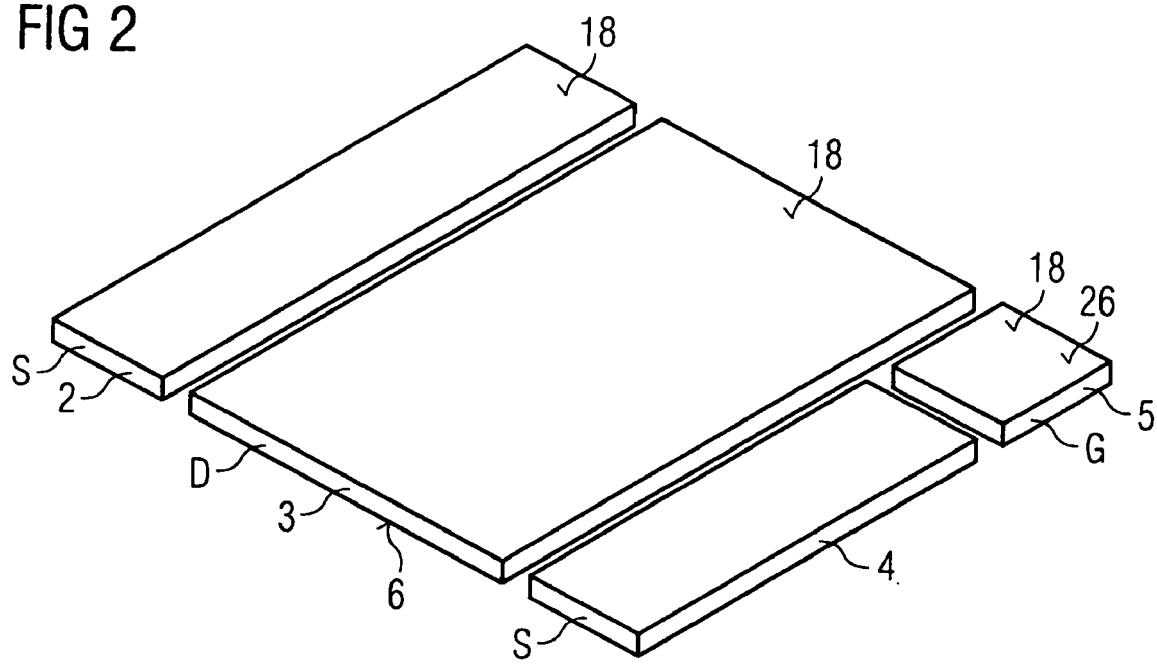
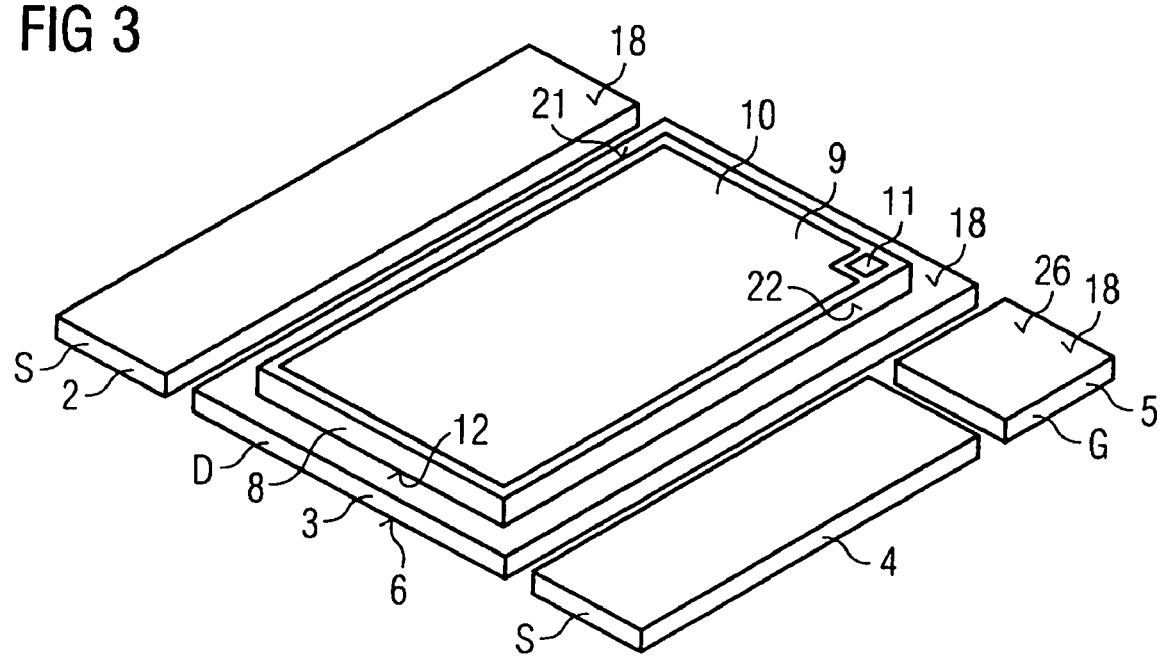

SEMICONDUCTOR DEVICE HAVING SURFACE MOUNTABLE EXTERNAL CONTACT AREAS AND METHOD FOR PRODUCING THE SAME

CROSS-REFERENCE TO RELATED APPLICATIONS

This Utility Patent Application claims priority to German Patent Application No. DE 10 2005 011 159.9 filed on Mar. 9, 2005, which is incorporated herein by reference.

FIELD OF THE INVENTION

The invention relates to a semiconductor device having surface mountable external contacts which project from a housing on the underside of the semiconductor device. In the housing, the semiconductor device has a semiconductor chip, the top side of the semiconductor chip having a source contact area and a gate contact area and the rear side of the semiconductor chip having a drain contact area. Semiconductor chips of this type form a semiconductor component also known as a "CoolMOS".

BACKGROUND

As chip miniaturization continues to increase, conventional housing technology such as is known from the document U.S. Pat. No. 6,319,755 B1 or from the document U.S. Pat. No. 6,249,041 B1 for semiconductor devices of this type is reaching its limits, especially as the housing technology cannot be reduced to the same extent as the miniaturization of the power semiconductor chips. In this case, heat dissipation and the limited current density are a main problem which severely limits or impairs the functionality of the high power semiconductors.

For these and other reasons there is a need for the present invention.

SUMMARY

The present invention provides a semiconductor component having a semiconductor chip which has a construction that enables an improved heat balance in conjunction with reduced semiconductor device dimensions.

The present invention provides for a semiconductor device having surface-mountable external contact areas and a method for producing the same. The surface-mountable external contacts are arranged as flat external contacts on the underside of the semiconductor device. The semiconductor chip of the semiconductor device has a source contact area and a gate contact area on its top side and a drain contact area on its rear side. The source contact area is fixed on a cutout of a heat sink, which is connected to a source external contact, a top side of the heat sink partly forming the top side of the semiconductor device. The drain contact area is electrically connected to a drain external contact and the gate contact area is electrically connected via a connecting element to a gate external contact on the underside of the semiconductor device. Consequently, the semiconductor device as areas which dissipate the heat loss both on the underside and on the top side.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 8 illustrate schematic perspective views of components of the semiconductor device in accordance with FIG. 1 during the method for producing the semiconductor device.

FIG. 2 illustrates a schematic perspective structure of external contacts of the semiconductor device on a mounting strip.

FIG. 3 illustrates a schematic perspective view of the structure in accordance with FIG. 2 after the application of a semiconductor chip.

FIG. 4 illustrates a schematic perspective view of the structure in accordance with FIG. 3 after the application of an adapted heat sink.

FIG. 5 illustrates a schematic perspective view of the structure in accordance with FIG. 4 after carrying out a connection to a gate external contact.

FIG. 6 illustrates a schematic perspective view after the structure in accordance with FIG. 5 has been embedded into a plastic housing composition.

FIG. 7 illustrates a schematic perspective view of the top side of the completed semiconductor device.

FIG. 8 illustrates a schematic perspective view of the underside of the completed semiconductor device.

DETAILED DESCRIPTION

Figure 1:
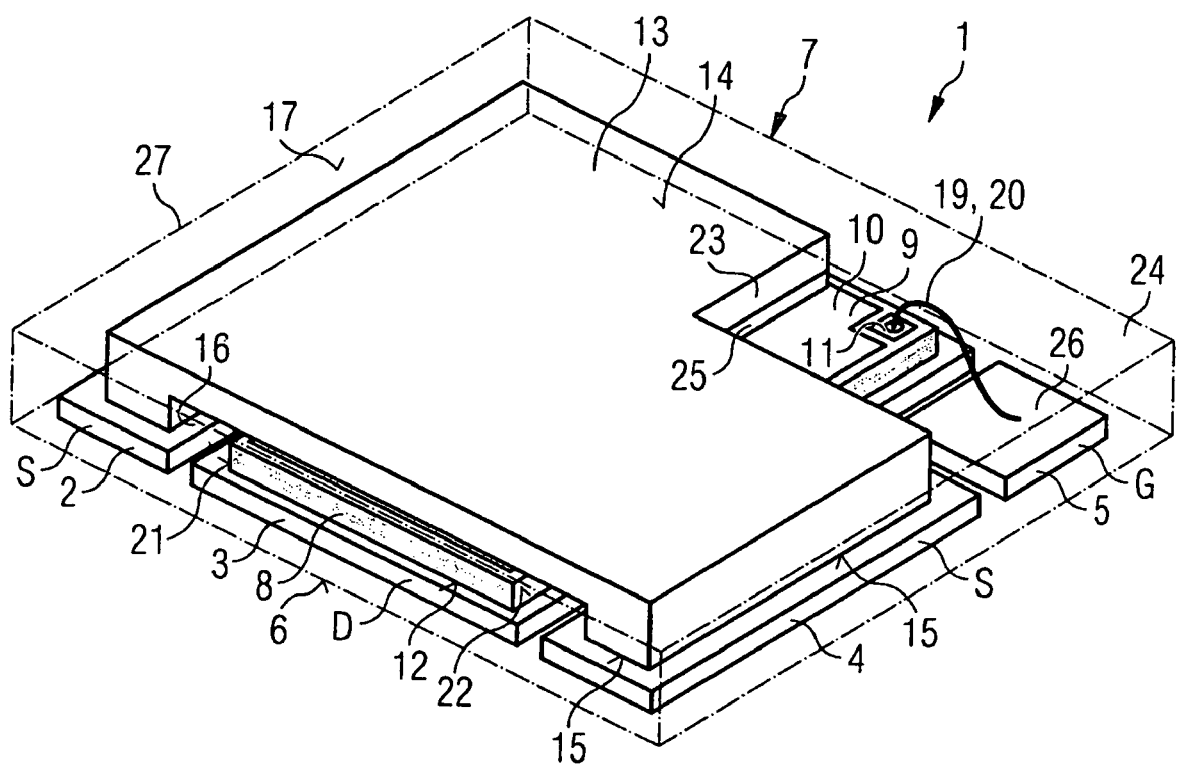
FIG. 1 illustrates a schematic perspective view of a semiconductor device of one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a semiconductor device having surface mountable external contacts, the external contacts comprising flat external contact areas on the underside of the semiconductor device housing. Within the housing, the semiconductor device comprises a semiconductor chip, which comprises a source contact area and a gate contact area on its top side and a drain contact area on its rear side. Furthermore, the semiconductor device comprises a heat sink within the housing, the heat sink having a top side, an underside and a cutout on the underside. The top side of the heat sink forms a co planar surface with the top side of the housing. Consequently, the heat sink can dissipate heat via its top side arranged on the top side of the housing.

In one embodiment, the semiconductor chip itself is arranged with its source contact area in the cutout of the heat sink, said source contact area being electrically connected to the heat sink. The underside of the heat sink and the drain contact area of the semiconductor chip are arranged within the housing on a housing plane formed by the surface mountable external contacts of the semiconductor device. In this case, the underside of the heat sink is connected to at least one source external contact and the drain contact area of the semiconductor chip is connected to a drain external contact, the gate contact area being electrically connected via a connecting element to a gate external contact on the underside of the semiconductor device.

This housing construction of a power semiconductor device in the form of a high voltage proof MOSFET can thus advantageously be intensively cooled simultaneously both on the underside of the housing via the surface mountable flat external contacts and from the top side of the housing with the aid of the heat sink at source potential. A particular advantage, moreover, is that the source potential, which is usually a ground potential, is present on the top side of the semiconductor device with the heat sink and the high voltage of the drain contact is not connected to the heat sink. Moreover, it is advantageous that when the semiconductor device is operated on a printed circuit board, the high voltage of the drain connection is covered by the housing of the semiconductor device, and, at the top side of the semiconductor device, only the ground potential of the source contact can be accessed via the surface region of the heat sink at the top side of the housing. It is thus ensured that a high voltage is not freely accessible on the printed circuit board. In addition, a further cooling element can be connected at any time to the housing internal heat sink on the top side of the semiconductor device in order to further improve the heat balance of the semiconductor device during operation.

In one embodiment of the invention, the electrical connections within the semiconductor device between source contact area and heat sink cutout, between heat sink underside and source external contact and also between drain contact area and drain external contact are planar connections. This has the advantage of achieving minimum heat transfers between the current carrying components of the semiconductor device. Such planar connections may comprise solder connections, but may also be achieved by means of conductive adhesive technology, solder pastes and/or by diffusion solders.

The abovementioned connecting element between gate contact area on the top side of the semiconductor chip and gate external contact may preferably be achieved by means of a bondable connecting element, in particular by means of at least one bonding wire. Instead of one bonding wire having a correspondingly large cross section, it is also possible to use a multiplicity of bonding wires having a smaller cross section, or a bonding tape may lead from the gate contact area on the top side of the semiconductor chip to the gate external contact.

The high dielectric strength of such semiconductor devices is achieved by means of a semiconductor chip having a drift path, said drift path, in the case of vertical MOSFETs, being connected from the source electrode arranged on the top side of the semiconductor chip to the drain electrode arranged on the rear side of the semiconductor chip via a gate electrode arranged on the top side of the semiconductor chip. Compensation zones are preferably arranged in the vertical drift path in the case of a compensation semiconductor device, such as the "CoolMOS", in order to reduce the forward resistance of the semiconductor chip in the region of the drift path.

In another embodiment of the invention, the heat sink with its cutout on its underside encloses the semiconductor chip on at least two of its opposite edge sides. It is thereby possible for two external contacts on the underside of the semiconductor device to be connected electrically and in large area fashion to the source contact area located on the top side of the semiconductor device.

In order to provide such a cutout, the heat sink comprises an extruded profiled metal sheet, the profile of which provides the cutout. Profiled metal sheets of this type can be produced inexpensively in large numbers by the extrusion method. In this case, the extrudate can be separated into a multiplicity of profiled metal sheets for heat sinks of the semiconductor devices.

In a further embodiment of the heat sink, the latter comprises a profiled metal sheet strip with a cutout for the gate contact area on the top side of the semiconductor chip. Such a cutout can be produced inexpensively as early as during the separation of a profiled metal sheet strip into individual heat sinks by stamping. The material of the heat sink in this profiled form with a cutout may comprise a copper or a copper alloy, and an aluminum or an aluminum alloy. These metals are predestined for use as a heat sink on account of their high thermal conductivity. In addition, heat sinks made of such materials may have oxidation resistant and corrosion resistant coatings in partial regions. This is possible particularly in the case of aluminum by means of corresponding anodizations. In the case of copper, this is achieved by depositing noble metals on the surfaces.

The housing may comprise either a plastic housing composition or a ceramic composition. In this case, plastic housing compositions are less expensive because they make it possible, by means of simple injection molding, for the components of the semiconductor device, such as the semiconductor chip, and also partly the heat sink and partly the external contacts to be embedded into the plastic housing composition. In the case of ceramic compositions, the embedding is possible by means of corresponding sintering processes. If the components are embedded in a plastic housing composition, then the surfaces which come into contact with the plastic housing composition are preferably provided with an adhesion promoting coating beforehand.

A method for producing a semiconductor device having surface mountable flat external contacts has the following method. The first process is to prepare an arrangement of flat external contacts for the surface mountable semiconductor device in a flat conductor leadframe. Furthermore, a semiconductor chip is produced, the top side of the semiconductor chip having a source contact area and a gate contact area and the rear side of the semiconductor chip having a drain contact area. Afterward, the semiconductor chip is fixed with its drain contact area on a drain external contact of the flat conductor leadframe. Finally, the gate contact area arranged on the top side of the semiconductor chip is connected to a gate external contact via a connecting element.

In parallel with the above method, a heat sink is produced for the semiconductor device according to the invention, the heat sink having a top side, an underside and a cutout on its underside for receiving the semiconductor chip in the cutout. Finally, the heat sink is fixed with its underside on at least one source external contact whilst the source contact of the semiconductor chip is simultaneously fixed in the cutout of the heat sink. After this relatively compact construction has been produced on a flat conductor leadframe, the components that have been assembled up to that point are embedded into a housing composition, the top side of the heat sink forming a coplanar area with the top side of the housing and the external contacts projecting with their flat external contact areas on the underside of the housing.

This method has the advantage that, with relatively inexpensive means, it is possible to produce a compact semiconductor device which can be intensively cooled both from its underside via the flat external contacts arranged there and from its top side via the heat sink. In this case, in an advantageous implementation of the method, the heat sink may be stamped from a profiled metal sheet, a cutout for the gate contact area arranged on the top side of the semiconductor chip simultaneously being provided during the stamping process.

Furthermore, the provision of a flat conductor leadframe can be carried out cost effectively in the case of this method by etching a corresponding metal sheet strip supported by a film in the corresponding structures of the external contacts. The film for the metal sheet strip can subsequently be used as a transporting film and mounting film for the application of the further components such as semiconductor chips, heat sink and connecting elements for the gate connection. Only after a molding method is the film removed from the underside of the semiconductor components produced. This method variant enables mass production of high power semiconductor devices with MOSFET semiconductor components.

To summarize, it must be emphasized that with this semiconductor device, additional free areas are created for the dissipation of heat and, consequently, it is possible to solve the problem of the heat balance and current limitation as semiconductor chip dimensions decrease. In this case, areas are afforded both on the top side of the housing and on the underside of the housing, with the result that an intensive dissipation of heat is possible even for short term loading and a relatively homogeneous distribution of heat is established for long term loading. Besides the conductive adhesive already mentioned or a soft solder material, the planar connections within the semiconductor device can also be achieved by means of solder pastes and by means of diffusion solders. The bonding wire used is preferably an aluminum wire which can be bonded on gold coatings of the gate contact area on the top side of the semiconductor chip and on gold coatings of a contact pad on the corresponding gate external contact.

FIG. 1 illustrates a schematic perspective view of a semiconductor device 1 of one embodiment of the invention. The semiconductor device 1 has the top side 14 of a heat sink 13 on its housing top side 17, and a plurality of flat external contacts 2 to 5 on its underside 6. The flat external contacts 2 to 5 are electrically connected to corresponding regions of a semiconductor chip 8. Thus, the flat external contact 3 as drain external contact D is electrically connected to the rear side 12 of the semiconductor chip 8 via a connecting layer 25 having a thickness of a few 100 nm, which may be a thin conductive adhesive layer or a thin soft solder layer or a correspondingly thin solder paste layer or a thin diffusion solder layer.

The top side 9 of the semiconductor chip 8 has a source contact area 10 and a gate contact area 11, the source contact area 10 taking up the larger proportion of area on the top side 9 of the semiconductor chip 8, and the gate contact area 11 merely being arranged on a corner of the surface 9 of the semiconductor chip 8. The source contact area 10 is in turn electrically connected to a cutout 16 of the heat sink 13 via a connecting layer 25 formed in planar fashion and made of a conductive adhesive or a soft solder or a solder paste or a diffusion solder. In addition to the cutout 16, into which the semiconductor chip 8 is fitted, the heat sink 13 has a cutout 23, which clears access to the gate contact area 11.

Consequently, the gate contact area 11, in the cutout 23 of the heat sink 13, can be connected to the gate external contact G via a connecting element 19 arranged there. In this embodiment of the invention, the connecting element 19 comprises an aluminum bonding wire 20 having a cross section adapted to the current flow. The bonding wire 19 is bonded on the gate contact area and fixed on a contact pad 26 of the gate external contact G, both the gate contact area 11 and the contact pad 26 having a gold coating.

With its cutout 16, the heat sink 13 encloses the edge sides 21 and 22 of the semiconductor chip 8 and has an underside 15 connected in planar fashion via corresponding connecting layers to two source contact areas S arranged on the underside 6 of the semiconductor device 1. In this case, the connecting layer has the same materials as the rest of the connecting layers within the semiconductor device 1 for planar connection of the individual components.

A broken line 27 marks the external contour of the housing 7 of the semiconductor device 1 in order to make it possible to view the internal components of the semiconductor device 1. In this embodiment of the invention, however, the housing 7 comprises a nontransparent plastic housing composition 24.

FIGS. 2 to 8 illustrate schematic perspective views of components of the semiconductor device 1 in accordance with FIG. 1 during the method for producing the same.

FIG. 2 illustrates a schematic perspective structure of external contacts 2 to 5 of the semiconductor device on a mounting strip, which has been omitted here in order to simplify the illustration. Such a mounting strip has a multiplicity of such structures of external contacts 2 to 5, which are arranged in rows and columns on the mounting strip for a multiplicity of semiconductor components. In this embodiment of the invention, the external contacts 2 to 5 are arranged in such a way that a large area drain external contact D is possible in the center. Two external contacts 2 and 4 serving as source external contact S are arranged on two opposite sides. Finally, the external contact 5 for the gate external contact G is provided in one corner. This structure of external contacts 2 to 5 forms an internal housing plane 18 with their top sides and is arranged on the underside of the housing with their undersides.

FIG. 3 illustrates a schematic perspective view of the structure in accordance with FIG. 2 after the application of a semiconductor chip 8. The semiconductor chip 8 is mounted onto the prepared drain external contact D of the flat conductor leadframe by its rear side 12, which has a drain contact area. In the course of this mounting, a planar connecting layer is provided between the drain contact area of the semiconductor chip 8 and the drain external contact D, which connecting layer may have a conductive adhesive, a soft solder, a diffusion solder or a solder paste. The top side 9 of the semiconductor chip 8 is principally taken up by the source contact area 10, a gate contact area 11 being provided in one corner of the top side 9 of the semiconductor chip 8.

Figure 4:
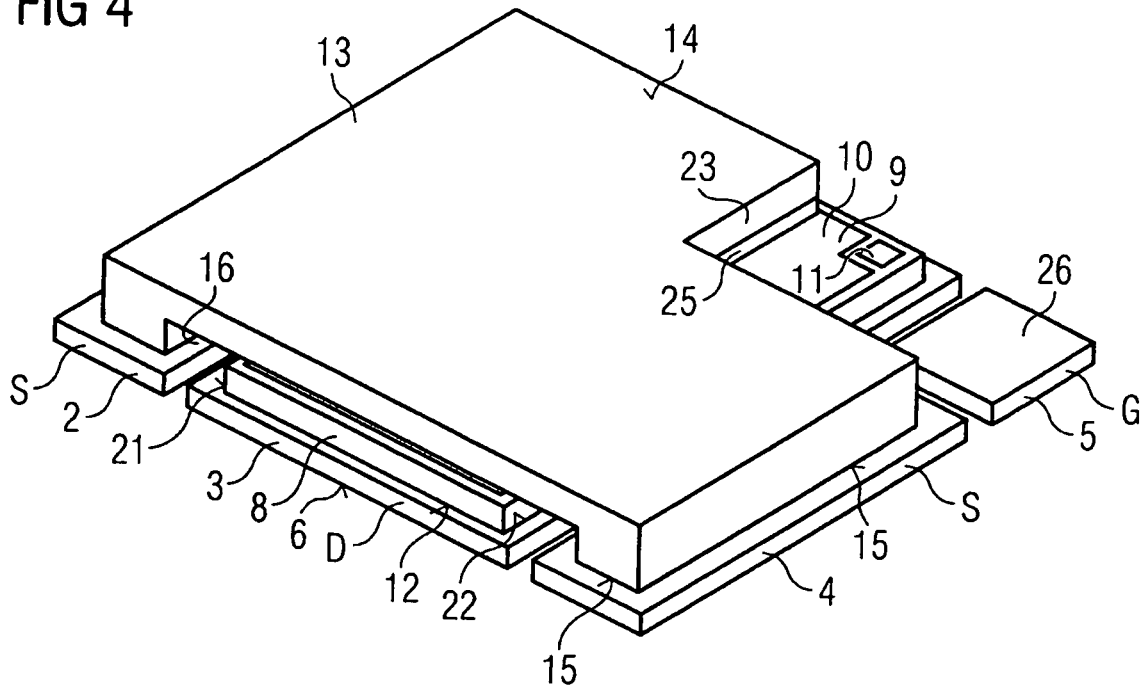

FIG. 4 illustrates a schematic perspective view of the structure in accordance with FIG. 3 after the application of an adapted heat sink 13. Said heat sink 13 is adapted to the semiconductor chip 8 in such a way that it has a cutout 16, the depth of which is configured in such a way that two planar connecting layers and the thickness of the semiconductor chip can be accommodated in the cutout 16. In this embodiment of the invention, the cutout 16 is configured in such a way that the heat sink 13 encloses the semiconductor chip 8 on two edge sides 21 and 22 and, with its underside 15, makes contact with the two flat external contacts 2 and 4 as source external contacts S via a corresponding connecting layer. Consequently, the heat sink 13 is at source potential, which is at ground potential in the customary application of such MOSFET power semiconductor devices. Besides the cutout 16, the heat sink 13 has a cutout 23, which clears access to the gate contact area 11 on the top side 9 of the semiconductor chip 8.

Figure 5:
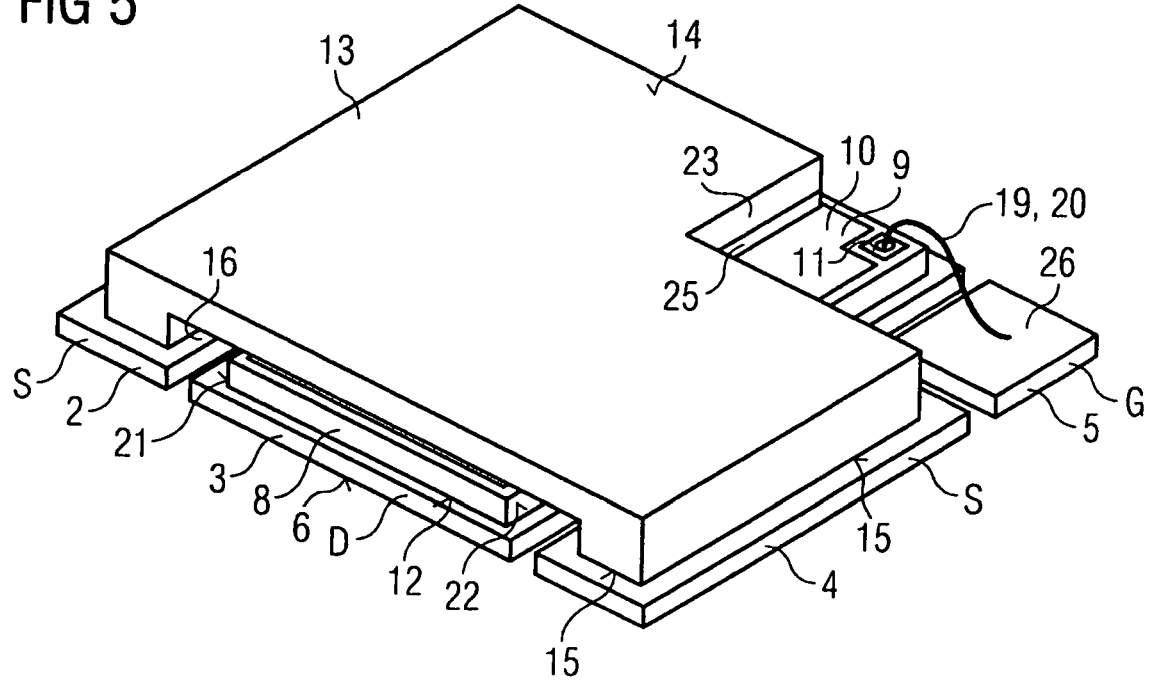

FIG. 5 illustrates a schematic perspective view of the structure in accordance with FIG. 4 after carrying out a connection to a gate external contact G. As already mentioned above, this connection is ensured by a bonding wire 20 made of aluminum.

Figure 6:
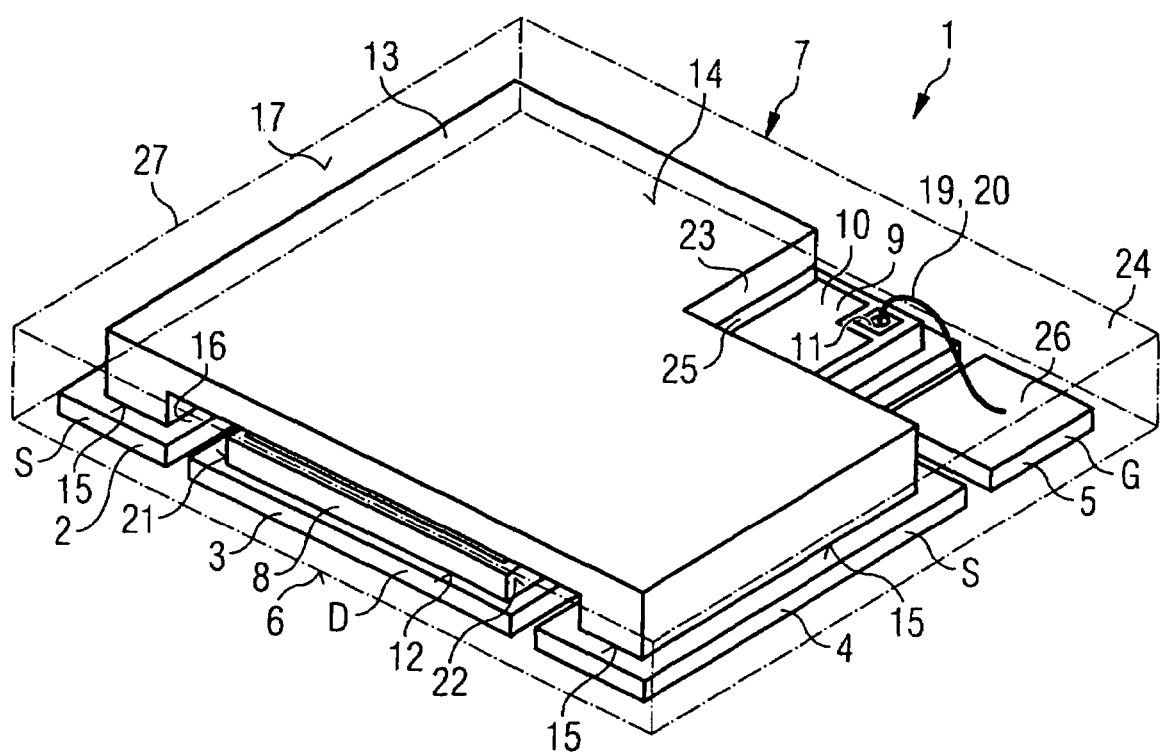

FIG. 6 illustrates a schematic perspective view after the structure in accordance with FIG. 5 has been embedded into a plastic housing composition 24. Components having functions identical to those in FIG. 1 are identified by the same reference symbols and are not explained separately. FIG. 6 accordingly shows the semiconductor device 1 in accordance with FIG. 1.

Figure 7:
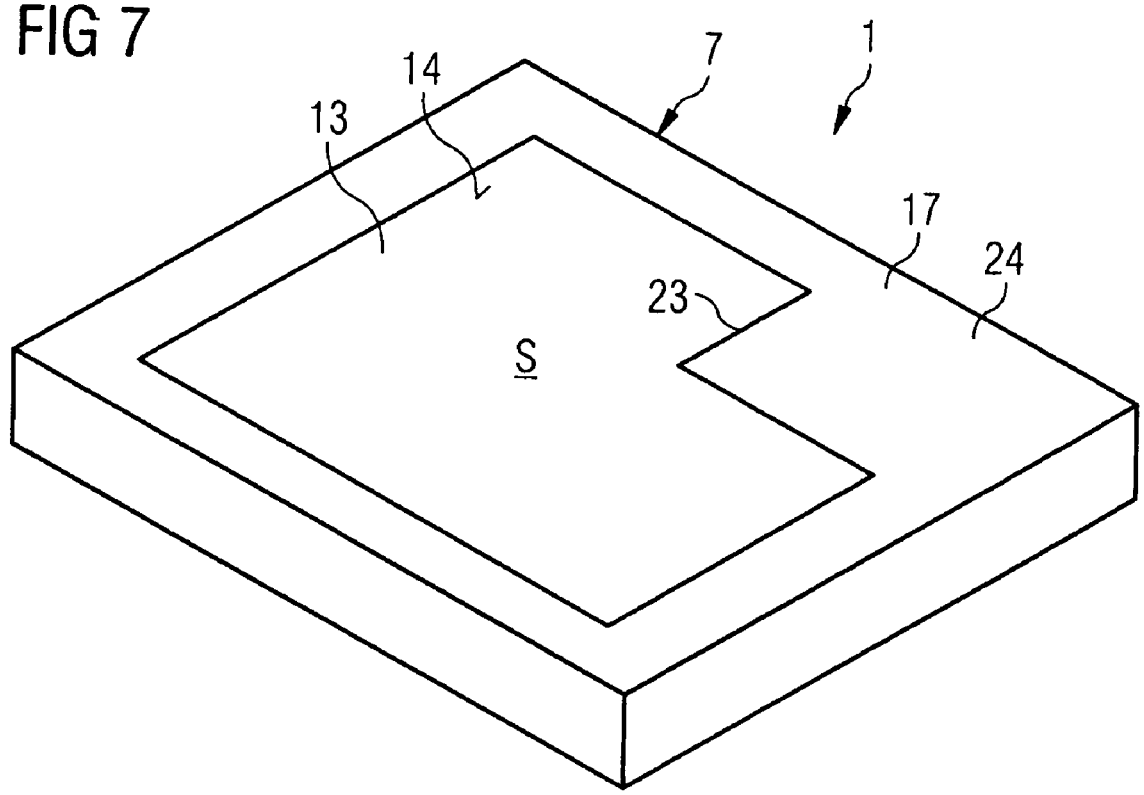

FIG. 7 illustrates a schematic perspective view of the top side 17 of the completed semiconductor device 1, the plastic housing composition 24 now no longer being illustrated in transparent fashion and exhibiting a co planar area on the housing top side 17 comprising the top side of the housing 7 and the top side 13 of the heat sink.

Figure 8:
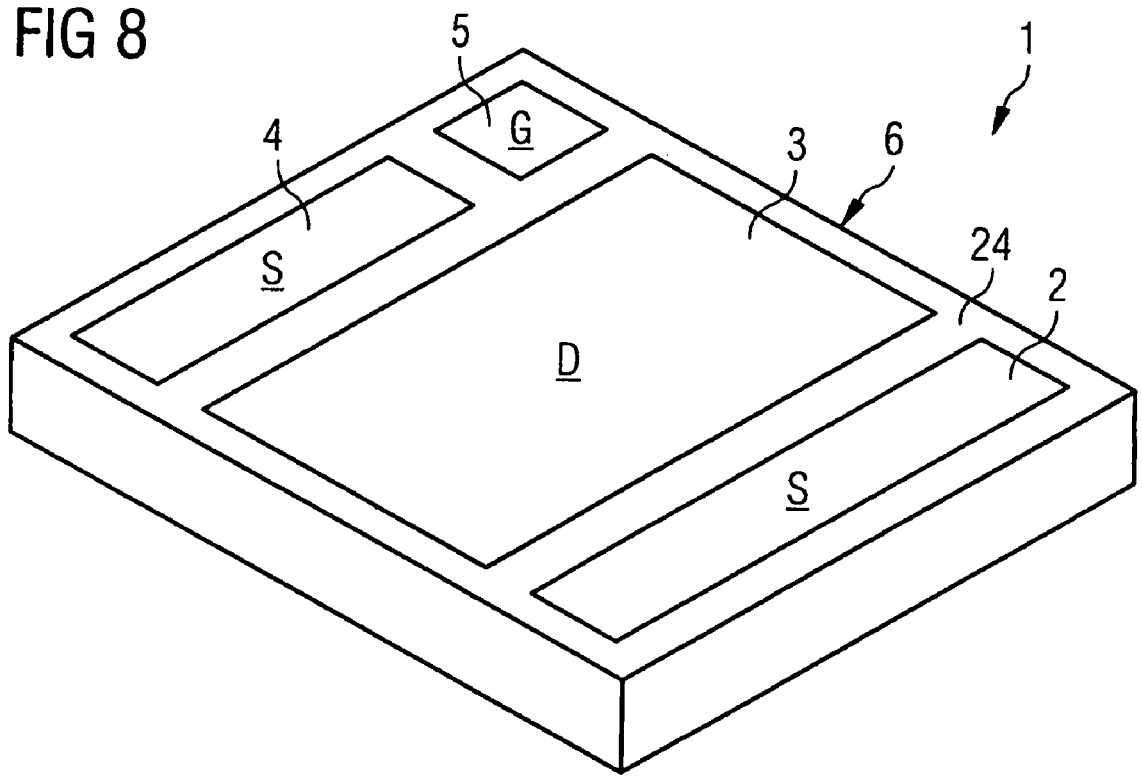

FIG. 8 illustrates a schematic perspective view of the underside 6 of the completed semiconductor device 1 with the external contact areas of the source external contacts S, of the drain external contact D and of the gate external contact G. The example illustrated here, on account of its good heat dissipation, permits a maximum current flow of 50 A instead of 25 A hitherto in the case of conventional device technology and identical external dimensions. The forward resistance was able to be reduced to 0.2 mΩ. The forward resistance for an identical semiconductor device using conventional technology has hitherto been 2.2 mΩ. In addition, the thermal junction resistance RTHJC was able to be lowered to 5 K/W instead of 35 K/W hitherto.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   surface-mountable external contacts arranged as flat external contacts on an underside of the semiconductor device, including a source external contact, a drain external contact and a gate external contact;
   a semiconductor chip having a top side and a rear side, the top side including a source contact area and a gate contact area, the rear side including a drain contact area; and
   wherein the source contact area is fixed on a cutout of a heat sink, which is connected to the source external contact, a top side of the heat sink partly forming the top side of the semiconductor device, the drain contact area is electrically connected to the drain external contact and the gate contact area is electrically connected via a connecting element to the gate external contact.

2. The semiconductor device according to claim 1, comprising wherein the electrical connections between source contact area and heat sink cutout, between heat sink underside and source external contact and also between drain contact area and drain external contact are planar connections within the semiconductor device.

3. The semiconductor device according to claim 1, comprising wherein the connecting element between gate contact area on the top side of the semiconductor chip and gate external contact is a bondable connecting element.

4. The semiconductor device according to claim 1, comprising wherein the semiconductor device is a high voltage proof power semiconductor device.

5. The semiconductor device according to claim 1, further comprising a plastic housing composition, wherein the connecting element electrically connecting the gate contact area to the gate external contact is completely embedded in the plastic housing composition.

6. A semiconductor device comprising:
   surface mountable external contacts, which comprise flat external contact areas on an underside of a housing of the semiconductor device, including a source external contact, a drain external contact and a gate external contact;
   a semiconductor chip having a top side and a rear side, the top side of the semiconductor chip comprising a source contact area and a gate contact area and the rear side of the semiconductor chip comprising a drain contact area; and
   a heat sink, the heat sink comprising a top side, an underside and a cutout on the underside, the top side of said heat sink forming a co planar surface with the top side of the housing, the semiconductor chip being arranged with the source contact area in the cutout and said source contact area being electrically connected to the heat sink, and the underside of the heat sink and the drain contact area of the semiconductor chip being arranged in a housing plane formed by the surface mountable external contacts, the underside of the heat sink being electrically connected to the source external contact, the drain contact area being electrically connected to the drain external contact and the gate contact area being electrically connected via a connecting element to the gate external contact on the underside of the semiconductor device.

7. The semiconductor device according to claim 6, comprising wherein the electrical connections between source contact area and heat sink cutout, between heat sink underside and source external contact and also between drain contact area and drain external contact are planar connections within the semiconductor device.

8. The semiconductor device according to claim 6, comprising wherein the connecting element between gate contact area on the top side of the semiconductor chip and gate external contact is a bondable connecting element, preferably at least one bonding wire.

9. The semiconductor device according to claim 6, comprising wherein the semiconductor device is a high voltage proof power semiconductor device.

10. The semiconductor device according to claim 6, comprising wherein the semiconductor chip is a vertical MOSFET.

11. The semiconductor device according to claim 6, comprising wherein the semiconductor chip is a compensation semiconductor device, preferably a "CoolMOS".

12. The semiconductor device according to claim 6, comprising wherein the heat sink with its cutout on its underside encloses the semiconductor chip on at least two opposite edge sides.

13. The semiconductor device according to claim 6, comprising wherein the heat sink comprises an extruded profiled metal sheet.

14. The semiconductor device according to claim 6, comprising wherein the heat sink comprises a profiled metal sheet strip with a cutout for the gate contact area on the top side of the semiconductor chip.

15. The semiconductor device according to claim 6, comprising wherein the heat sink comprises copper or a copper alloy.

16. The semiconductor device according to claim 6, comprising wherein the heat sink comprises oxidation resistant and corrosion resistant coatings in partial regions.

17. The semiconductor device according to claim 6, comprising wherein the heat sink comprises aluminum or an aluminum alloy.

18. The semiconductor device according to claim 6, comprising wherein the housing comprises a plastic housing composition, into which the semiconductor chip and partly the heat sink and also partly the external contacts are embedded.

19. The semiconductor device according to claim 6, comprising wherein the housing comprises a ceramic composition, into which the semiconductor chip and partly the heat sink and also partly the external contacts are embedded.

20. The semiconductor device according to claim 6, comprising wherein the surfaces of the heat sink which are embedded into a plastic housing composition comprise an adhesion promoting coating.

\* \* \* \* \*